US00RE35027E

United States Patent [19]

Ragard

[11] E Patent Number: Re. 35,027

[45] Reissued Date of Patent: Aug. 29, 1995

[54] PICK AND PLACE METHOD AND APPARATUS

[75] Inventor: Phillip A. Ragard, Binghamton, N.Y.

[73] Assignee: Delaware Capital Formation, Inc., Wilmington, Del.

[21] Appl. No.: 131,561

[22] Filed: Oct. 4, 1993

Related U.S. Patent Documents

Reissue of:

[64] Patent No.: 4,872,258
Issued: Oct. 10, 1989
Appl. No.: 247,512
Filed: Sep. 22, 1988

U.S. Applications:

[63] Continuation of Ser. No. 888,314, May 27, 1992, abandoned, which is a continuation of Ser. No. 773,154, Oct. 8, 1991, abandoned.

[51] Int. Cl.[6] ..... H05K 3/30

[52] U.S. Cl. ..... 29/740; 29/742; 29/743; 29/33 J; 83/411.7; 198/476.1; 198/802

[58] Field of Search ..... 29/739, 740, 741, 742, 29/743, 563, 785, 792, 335; 83/411.7, 552; 198/477.1, 476.1, 802; 221/233, 234

[56] References Cited

U.S. PATENT DOCUMENTS

| | | | |
|---|---|---|---|
| 4,372,802 | 2/1983 | Harigane et al. | 29/743 X |
| 4,458,412 | 7/1984 | Dean et al. | 29/705 |
| 4,510,683 | 4/1985 | Fedde et al. | 29/743 X |
| 4,587,703 | 5/1986 | Azizi et al. | 29/743 X |
| 4,611,397 | 9/1986 | Janisiewicz et al. | 29/834 |
| 4,843,711 | 7/1989 | Rager . | |

OTHER PUBLICATIONS

"Multigripper Robot Slashes Insertion Time 75 Percent", Electronic Packaging and Production, Jun. 1988, p. 12.

"Sutromat SMD 201", advertising brochure of Sutron Electronic GmbH, undated.

"STM-77 Turret Method Suction Head", advertising brochure of Nitto Kogyo Co., Ltd, undated.

*Primary Examiner*—Joseph M. Gorski
*Attorney, Agent, or Firm*—Banner & Allegretti, Ltd.

[57] ABSTRACT

A turret assembly is movable in X and Y and a turret of the assembly is rotatable to position a selected one of a plurality of spindles at a transfer station of the turret. The selected spindle is telescopic to pick a component from a supply point and to place the component at a placement point on a circuit board or the like. An assembly for squaring, centering, orienting, and/or testing a component being held by another spindle of the turret is actuated generally concurrently with extending of the selected spindle. Alternatively, the spindle at the transfer station may be retained in the retracted position during actuation of the squaring assembly. Much time is saved by loading components on the plurality of the spindles of the turret at one or more supply stations and then placing all of these components without the need for transferring back and forth between the supply and P.C. board.

17 Claims, 6 Drawing Sheets

5
5
66
44
58
60
42
64

23
38
36
40
V4
C1
V2
S2
76
78
C3
C2

20
Z
Y
X

PICK AND PLACE METHOD AND APPARATUS

Matter enclosed in heavy brackets [ ] appears in the original patent but forms no part of this reissue specification; matter printed in italics indicates the additions made by reissue.

This application is a continuation of U.S. application Ser. No. 07/888,314, filed on May 27, 1992 and now abandoned, which is a continuation of U.S. application Ser. No. 07/773,154 filed on Oct. 8, 1991 and now abandoned, which is a Reissue of U.S. Pat. No. 4,872,258.

PRIOR ART CROSS REFERENCES

U.S. Pat. No. 4,458,412—Dean, et al., "LEADLESS CHIP PLACEMENT MACHINE FOR PRINTED CIRCUIT BOARDS", issued Jul. 10, 1984.

U.S. Pat. No. 4,611,397—Janisewicz, et al., "PICK AND PLACE METHOD AND APPARATUS FOR HANDLING ELECTRICAL COMPONENTS", issued Sep. 16, 1986.

U.S. Pat. No. 4,721,907—Dean, et al., "APPARATUS FOR AUTOMATED TESTING OF SURFACE MOUNTED COMPONENTS", issued Jan. 26, 1988.

BACKGROUND OF THE INVENTION

The present invention relates to apparatus for the precision placement of electronic components on a hybrid circuit substrate and, more particularly, to the placement of small articles such as semiconductor chips, capacitor chips and integrated circuit chips on a ceramic substrate which has been preprinted with a thick film conductor pattern.

As the name suggests, hybrid circuits are a combination of discrete and integrated circuit techniques. As in integrated circuits, conductors, resistors and conductive lands are printed on a ceramic substrate. In thick film technology, the printed elements are generally several mils thick. Then discrete chips are precisely positioned over the conductive lands and subsequently bonded in position in a manner to complete the electrical circuit. The printed conductor lands provide a pattern which precisely matches to the corresponding conductive portions of the chips that connect to the circuit elements within the chip as by solder. The bonded chips and substrate, with an exposed lead frame, are frequently encapsulated in toto in a potting compound for protection against physical and environmental damage. Use of unencapsulated chips on the circuit board allows for the manufacture of physically smaller circuits than those where discrete components which have already been encapsulated have their leads inserted into circuit boards fired with receiving connectors or into predrilled holes wherein the leads are subsequently cut and clinched. A primary advantage of chips is their small size, some being nearly microscopic. Chips in the order of 0.030 by 0.030 inches square and 0.010 thick and solder connection portions and conductor lands in the order of 0.005 inches in height and width, and spaced apart by similar distances, are not uncommon. Nevertheless, for the hybrid circuit technique to be successful, the small chips must be positioned and oriented such that when placed on the substrate, all solder connection portions and lands are properly connected without error. This requires a high degree of precision in positioning which was achieved in early development of these techniques by human operators using microscopes and tweezers.

The need for automatic, rapid, precise, repeatable and low cost means to position and bond chips on substrates was apparent if the burgeoning requirements of mass production in the electronics industry were to be met. Generally speaking, in the apparatuses which have been developed in the past, the chip or other small component, e.g., beam leaded components, are picked up by a hollow probe device which is connected to a vacuum source. When the probe touches the upper flat surface of the chip, the vacuum within the probe holds the chip against the probe end. The chip is then raised, translated in X and Y to the appropriate location above substrate, and lowered in Z onto the substrate. Prior attempts have been made to improve the precision of placement of the components onto the circuit board by combining centering fingers with the vacuum probe. Thus, while the probe supports the component by vacuum, the fingers center the component relative thereto prior to placement. Permanent bonding of chip to substrate is accomplished in some systems while the probe continues to hold the chip. In other systems, the conductive lands are pretreated with some form of tacky adhesive or soldering flux. The probe gently presses the chip surface into the tacky adhesive so that electrical contact is made with the conductive lands. Then the vacuum within the probe is released and the chip remains adhered to the substrate as the probe is withdrawn. A positive gas pressure within the probe is sometimes used to separate the chip from the probe.

In one form of the prior art, the substrate and the chip are both separately, fixedly and precisely oriented and located. A transfer mechanism, usually utilizing a vacuum probe as described above, travels an invariable, repetitive path to pick up the chip and place it at one selected position on the substrate. Then, a new substrate and new chip are fed into their respective positions and the operation repeats. In another form, the chips start out with a degree of disorientation, for example, at random in a vibratory feeder bowl. The feeder bowl, in the known manner, operates to bring each chip in turn to a precise position. From that point, the design is similar to the first category; although additional steps to angularly orient the chip may be required intermediate the feeder bowl and the precisely located substrate. Still other prior art has combined these two categories.

In the device of U.S. Pat. No. 4,611,397, components are successively placed by a hollow pick and placement spindle having motion in the X-Y and Z planes. The spindle, using a vacuum, picks up components individually from a plurality of precisely fixed input stations, e.g., component trays, racks, feeder bowls, behind the machine and delivers them to varied locations on the substrate until the component placements have been completed. To assure precision placement of components, the substrate edges and the spindle housing provide X-Y reference points, and pivoted fingers attached to the spindle homing center the chip on the spindle while correcting for slight misorientations about the Z-axis i.e., less than 45°, prior to placement, so the chip need not be precisely positioned at the input station for selection. Additionally, the support for the centering fingers is rotated about the vacuum probe axis, while the fingers are closed on the component, to provide control of the chip during angular orientation as the circuit board layout requires.

In U.S. Pat. No. 4,458,412, a carousel provides random vertical supply of taped components to a feeder assembly which feeds individual chips onto a nozzle of a turret-type vacuum head at a pick-up station. The turret-type head has four nozzles spaced 90° apart about the central axis of the head. As the turret is rotated, a chip is transported by a nozzle sequentially from the pick-up station to a centering and testing station, a centering and orienting station, and a placement station. Located between the testing and orienting stations is a chip removal station for ejecting defective or inverted chips. Sensors are located at the adhesive and placement stations to detect defective P.C. boards so that they may be bypassed. A controller, such as a digital computer, provides additional monitoring and controls the operation of the machine.

None of the prior art teaches a turret with multiple spindles thereon whereby the turret addresses one or more supply stations to load the spindles and then translates to a circuit board to place the components selectively at various points on the circuit board.

SUMMARY OF THE INVENTION

A turret assembly is movable in X and Y and a turret of the assembly is rotatable to position a selected one of a plurality of spindles at a transfer station of the turret. The selected spindle is telescopic to pick a component from a supply point and to place the component at a placement point on a circuit board or the like. An assembly for squaring, centering, orienting, and/or testing a component being held by another spindle of the turret is actuated generally concurrently with extending of the selected spindle. Alternatively, the spindle at the transfer station may be retained in the retracted position during actuation of the squaring assembly. Much time is saved by loading components on the plurality of the spindles of the turret at one or more supply stations and then placing all of these components without the need for transferring back and forth between the supply and P.C. board.

DETAILED DESCRIPTION OF THE INVENTION

Figures 4, 8:
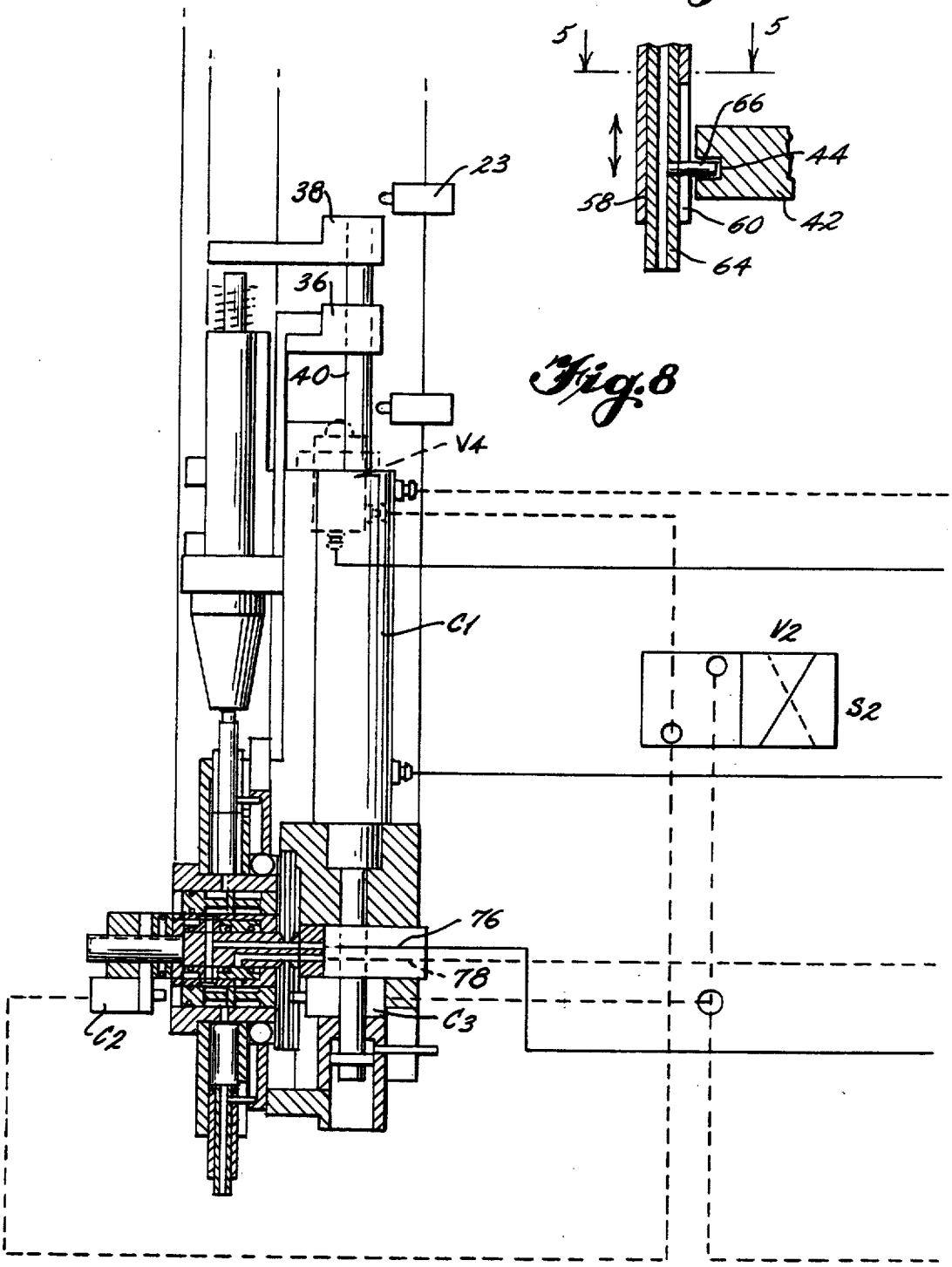
FIG. 4 is a cross sectional view through the spindle for illustrating the structure by which the spindle is extended and retracted.
FIG. 8 is a schematic illustration of the fluid pressure lines and controls for the apparatus of the invention.
Figure 5:
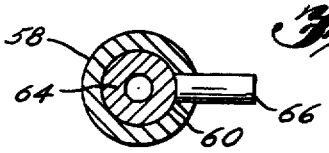
FIG. 5 is a cross section as generally viewed in the direction of arrows 5—5 of FIG. 4.

With reference to the drawings, a component handling "pick" and "place" head may be attached to an overhead arm (not shown) which is translatable in X and Y so as to address various supply stations with the head for retrieving or "picking" components therefrom and subsequently "placing" the components at selected locations on a printed circuit board or the like. Hub 74 is affixed to a main bracket 20 of the pick and place head so as to support a turret 50 for rotation upon hub 74. A timing wheel 57 is attached to turret 50 so that turret 50 may be driven via timing belt 56, and servo motor 52 according to a programreable controller, in order to selectively position any of eight different spindles 64 for component picking or placing and/or for squaring a component which is already held by one of the vacuum spindles Turret 50 has eight radially projecting tubular members 58 for guidingly supporting the spindles 64. Referring to FIGS. 4 and 5, each guide 58 has a lengthwise slot 60 through which a pin 66 of a corresponding spindle 64 projects so as to ride in annular groove 24 of a ring 22 affixed to main bracket 20. The engagement of pins 66 in groove 24 maintains the retracted condition of the spindles 64 during rotation of turret 50.

A gap is provided in ring 22, and a portion of spindle displacer 42 extends into the gap and is slidable radially relative to hub 74. Displacer 42 has actuate groove 44 which cooperates with annular groove 24, when displacer 42 is in the upward or retracted position, such that pin 66 of a spindle 64 may pass from the annular groove 22 into arcuate groove 44 during rotation of turret 50. Thus, when a spindle 64 has been situated at the lowermost position (with reference to FIGS. 1 and 2), it can be extended and retracted by vertical movement of displacer 42.

Turret 50 has holes 70 corresponding to each spindle 64, with each hole 70 accommodating a spool valve 68 therein. When a particular spindle is positioned for extension and retraction via displacer 42, the corresponding spool valve 68 is displaceable (laterally as viewed in FIG. 2). Extension of the piston rod of either air cylinder C2 or air cylinder C3 will displace the spool valve so as to provide negative, positive or neutral air pressure at the tip of the extended spindle.

Spindle displacer 42 has a "dashpot" type of sliding attachment to the lower end of the double ended piston rod 40 of cylinder C1. This connection between displacer 42 and rod 40 allows spindle 64 to retract slightly against an air spring when the tip of spindle 64 is advanced into engagement with a component body during "picking" of the component as well as when the component body engages the printed circuit board during "placing" of the component. Fluid is admitted to and evacuated from cylinder C1 via fittings 46 and 48 according to the controller program.

In addition to picking and placing components, it is also possible to square, center, and orient components about the longitudinal axis of the vacuum spindle and to test electrical functioning of the component. To that effect, a squaring assembly 90 is rotatably mounted within a support bracket 92 which, in turn, is slidable radially toward and away from turret 50 on main bracket 20 and is biased toward turret 50 by a tension spring 94. Bracket 92 has a screw 96 for engaging main bracket 20 so as to provide an adjustable limit of movement of bracket 92 in one direction (approximately 3/16 of an inch in a prototype of the device). Bracket 92 is raised against the tension of spring 94 (to the position of FIG. 2) by means of member 36 which is attached to an upper end of double ended piston rod 40. Moving rod 40 so as to lower member 36 allows spring 94 to bias bracket 92 downwardly until screw 96 engages bracket 20, resulting in squaring ringers 100 of tooling 98 being positioned appropriately for subsequent closing upon a component being held by the uppermost spindle 64.

Member 38 also is attached to the upper end of the double ended piston rod 40 of cylinder C1. Actuation rod 102 normally is biased upwardly by compression spring 104, and the normally opened component engaging fingers 100 are closed when rod 102 is depressed by member 38.

Gears 106 and 112 intermesh so that tooling 98 is rotatable about its longitudinal axis, upon actuation of stepping motor 110 according to the programmed control, so as to reorient a component which has been squared by and is still held in the fingers 100. Any well known connection is provided between the hub of gear 106 and rod 102 so that squaring fingers 100 are reorientable about the longitudinal axis of tooling 98 in both the raised and lowered conditions.

Figure 1:
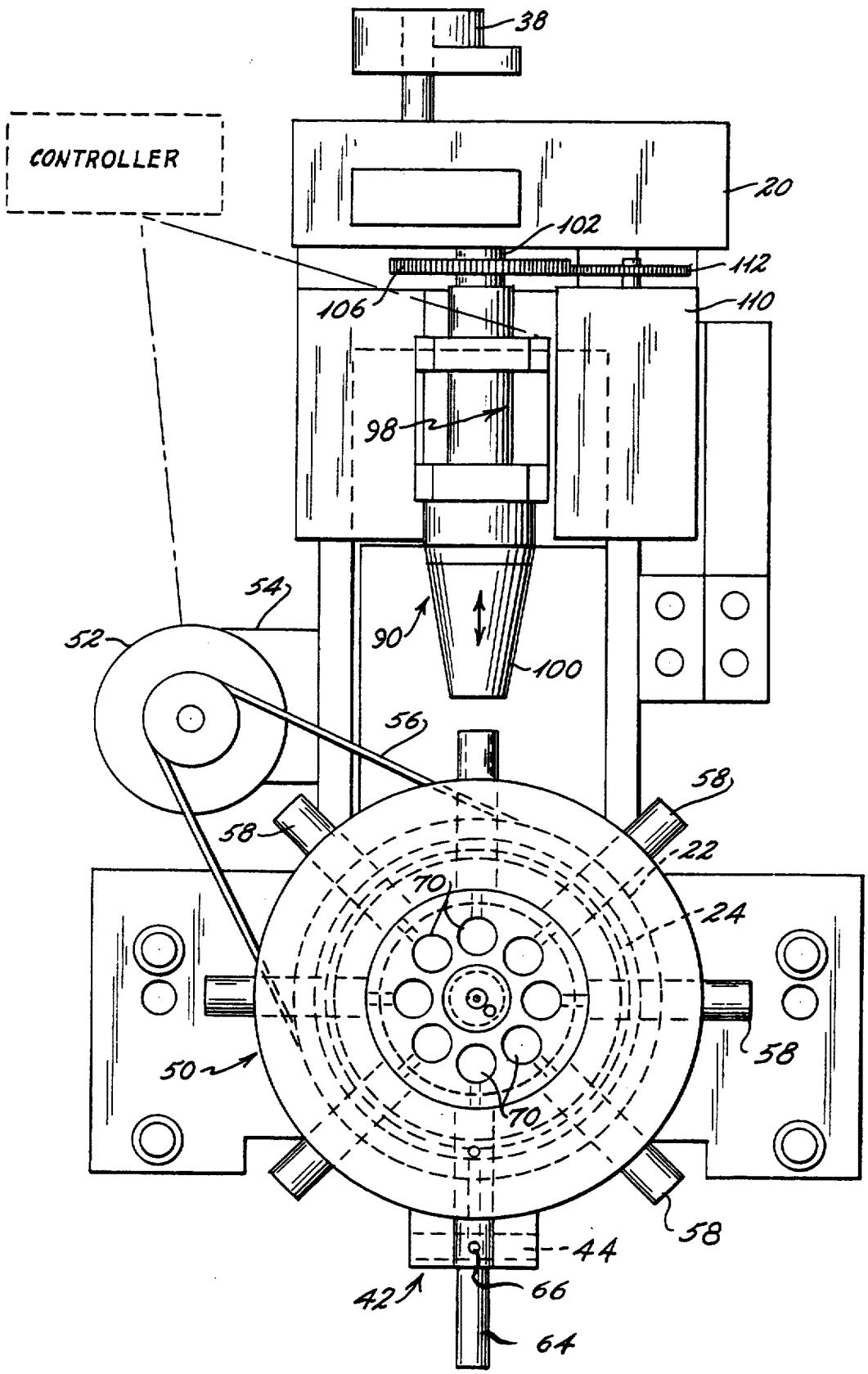
FIG. 1 is a partial front elevation of the apparatus of the invention.
Figure 2:
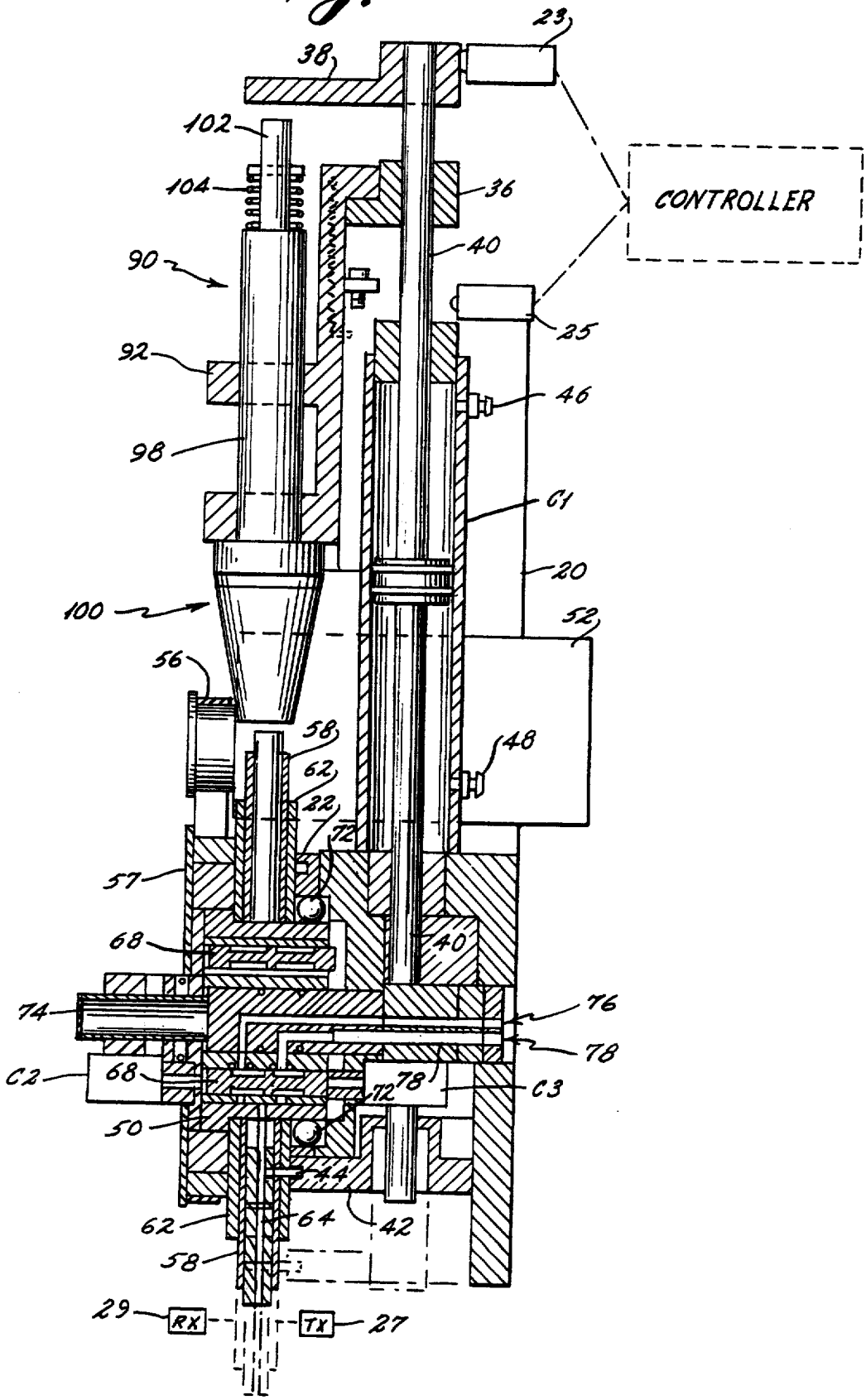
FIG. 2 is a cross section as generally viewed in the direction of arrows 2—2 of FIG. 1.

According to programmed control of an X-Y positioning system, the pick and place head illustrated in FIGS. 1, 2, and 8 is moved to an appropriate component: supply such as a reeled tape feeder. When so positioned, spindle 64 is lowered by actuation of cylinder C1 to move spindle displacer 42 from the solid line position to the bottom most phantom line position of FIG. 2 for extension of spindle 64. The dashpot-like connection between displacer 42 and rod 40 allows displacer 42 to move (for instance, to the phantom line middle position of FIG. 2) during picking and placing of components in order to accommodate components of various heights.

Thus, spindle 64 is extended to engage a component and hold it by vacuum during retraction of the spindle by cylinder C1, whereupon the turret 50 is rotated to position another spindle for the subsequent picking operation. In a prototype of the invention, the pick and place head is provided with a transmitter which is aligned with a corresponding receiver located at each supply station during picking of a component therefrom so as to control indexing of the next component into position for a subsequent pick up. Having picked up a component, turret 50 is rotatable to position another spindle for "picking" from the same supply station. Alternatively, the pick and place head could be moved in X and Y to position each spindle at a different supply according to the needs of the user and the program provided to the controller.

A reverse operation generally is performed in placing the component at a selected location on the circuit board. Before, during, and/or after X-Y positioning of the head, the turret is rotatable to position any one of the eight spindles for placement of a component at the selected location on the circuit board. Further, assembly 90 provides squaring, centering, orienting and/or electrical function testing of the component held on the uppermost vacuum spindle 64 when lowermost spindle 64 is extended. Alternatively, it is contemplated that relative movement could be provided between assembly 90 and the uppermost spindle 64 to accomplish these functions without the necessity of extending the lowermost spindle 64.

OPERATION

Figure 3:
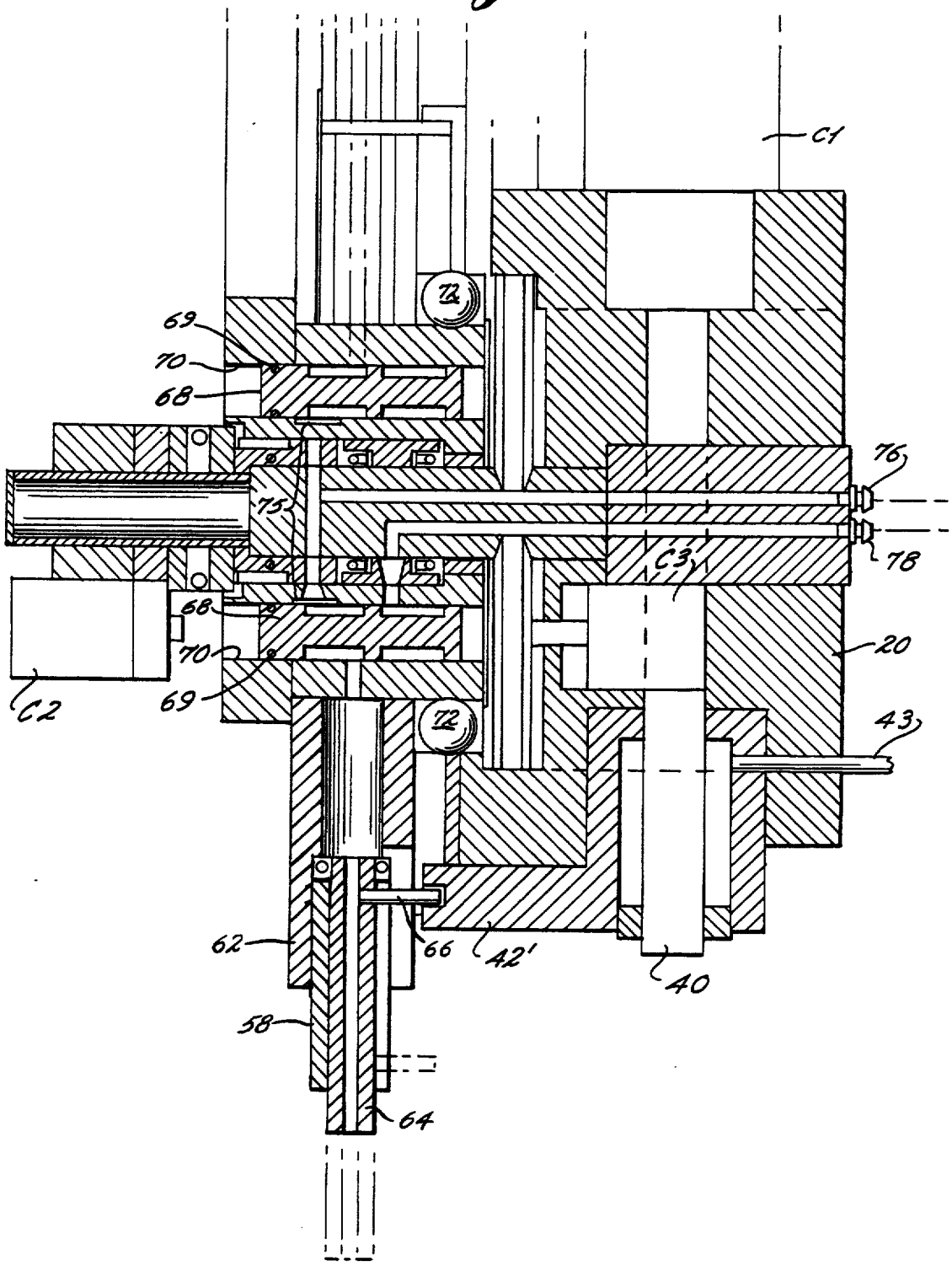
FIG. 3 is an enlarged cross section through the hub of the turret in order to illustrate the control of various air pressure condition on the tip of the spindle.

In preparation for performing the "picking" mode of operation: (a) solenoids S1 and S2 are not actuated, (b) air is routed to the bottom of cylinder C1 via valve VI to ensure that the picking spindle is in the retracted position, (c) air is always available to an input of valve V4, and a plunger thereof normally is spring biased upwardly to prevent a fluid path through V4, (d) vacuum is always available to the hub at 76, and (e) spool valve 68 is displaced leftward from the position of FIG. 3 so that the tip of the spindle is at atmospheric pressure.

For picking, the pick and place head is positioned in X and Y such that the picking spindle 64 (the bottom most spindle as viewed in FIGS. 1 and 2) is located above a component at a supply station. Then, solenoid S1 is actuated to change the state of valve V1 such that positive air is supplied to the top and evacuated from the bottom of cylinder C1, resulting in extension of piston rod 40 and, in turn, extension of spindle 64 by spindle displacer 42. With such extension, member 36 depresses the plunger of valve V4 so that air is ported through V4 to cylinder C2 by way of V2, whereupon cylinder C2 causes the spool valve 68 to be displaced to the position of FIG. 3. Thus, spool valve 68 completes a path between hub 74 and spindle 64 for vacuum to hold a component on the tip of the spindle.

Sensor 25 is actuated by member 36 during such extension of the spindle 64 so that solenoid S1 is deactivated and a spring changes the state of valve V1 to reroute positive air through valve V1, causing cylinder C1 to retract the vacuum spindle 64 which is holding a component. Complete retraction of the spindle is detected by engagement of member 38 with a sensor 23 (FIG. 2) whereupon a transmitter 27 and receiver 29 are used to detect presence or absence of the component on the tip of the retracted spindle. If a component is detected on the spindle tip, turret 50 is indexed (a selectable amount according to the controller) so as to position the next appropriate spindle for extension and pick up of a component.

Hub 74 is provided with an annular groove 75 (FIG. 3) by which vacuum is maintained on all of the spindles which are not in position for extension by displacer 42. During rotation of turret 50, the corresponding spool valve 6 for each of these spindles 64 is retained (in the position of FIG. 3) by the friction of an O-ring 69 with the internal diameter of port 70.

As many of the spindles 64 as desired may be loaded with components by this "picking" procedure. It should be noted that member 36 clears the spring biased plunger of valve V4 when the spindle is raised so as to disconnect the air path between V4 and V2 and prevent actuation of cylinders C2 and C3.

For "placing" the components held on vacuum spindles 64, turret 50 is rotated selectively to present the appropriate spindle for extension. Turret 50 can be rotated prior to, during, or after repositioning of the overall head in X and Y so as to locate the appropriate spindle over the appropriate placement location on a circuit board. Solenoid S2 is activated to change the state of valve V2 and is maintained in this activated state until all of the placing operations are completed. Thus, a fluid path is made available from valve V2 to cylinder C3 and the control portion of valve V3, although no air is actually supplied via this path until the plunger of valve V4 is engaged by member 36.

Next, solenoid S1 is activated to change the state of valve V1 so that the supply and exhaust of air for cylinder C1 is reversed so as to displace piston rod 40 and extend the appropriate spindle 64 for placement of a component on the circuit board. With lowering of rod 40, member 36 depresses the plunger of valve V4 so that air is ported therethrough to valve V2 which, in turn, ports air to cylinder C3 and to the control inlet of valve V3. Thus, cylinder C3 displaces spool valve 68 (to the left as viewed in FIG. 3) so as to provide a path between positive air inlet 78 of hub 74 and the spindle 64. The control air supply to valve V3 causes a pulse of air which was previously stored therein to be supplied to the inlet 78 of hub 74 so that an "air kiss" ensures release of the component from the tip of spindle 64 during placing of the component. Valve V3 automatically resets to capture another pulse of air therein.

Sensor 25 detects the lowered position of member 36 so as to indicate that the spindle 64 is fully extended and that the controller may deactivate solenoid S1. Thus, the state of valve V1 is changed to reroute air therethrough for retraction of the spindle. It may be advantageous to program a delay for changing of solenoid S1 when the spindle is fully extended so as to allow for settling time of the spindle and/or additional time for orienting or testing another component by assembly 90.

With the spindle retracted, turret 50 is rotated to link the next appropriate spindle 64 with displacer 42, and the pick and place head is repositioned over the circuit board for placing the next component thereon. This process is continued as required for placement of the other components. It should be noted that the retracted position of the spindle is detected by sensor 23 being activated by member 38, at which time transmitter and receiver system 27, 29 is used to detect the presence or absence of a component on the spindle.

During each displacement of double ended piston rod 40 of cylinder C1, a bracket 92 is lowered and fingers 100 of a squaring assembly 90 are closed upon any component which is held by the uppermost spindle 64. For an understanding of the structure and operation of assembly 90, the reader is referred to U.S. Pat. No. 4,721,907 illustrating tester fingers utilized in testing electrical functioning of a component during squaring and centering thereof and U.S. Pat. No. 4,611,397 illustrating centering fingers which may be rotated about a central longitudinal axis of the device so as to reorient the component. It is contemplated in the instant invention to incorporate the squaring, centering, and orienting feature into the device of U.S. Pat. No. 4,721,907 or, alternatively, to incorporate the electrical function testing feature into the device of U.S. Pat. No. 4,611,397, in order to provide the functions required of assembly 90. It is preferred that the component remains on the tip of the spindle 64 while being operated on by assembly 90, as practiced at the test and orient stations of U.S. Pat. No. 4,458,412, but without extending spindle 64 for these functions.

Figure 6:
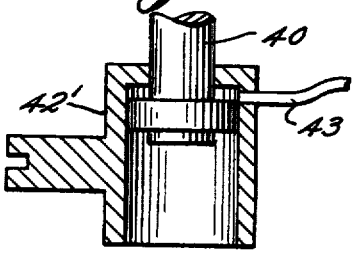
FIGS. 6 and 7 illustrate a structure by which the spindle at the component transfer station of the turret may be held in the retracted state during downward displacement of piston rod 40.
Figure 7:
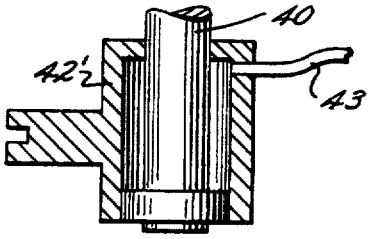
Figure 8:
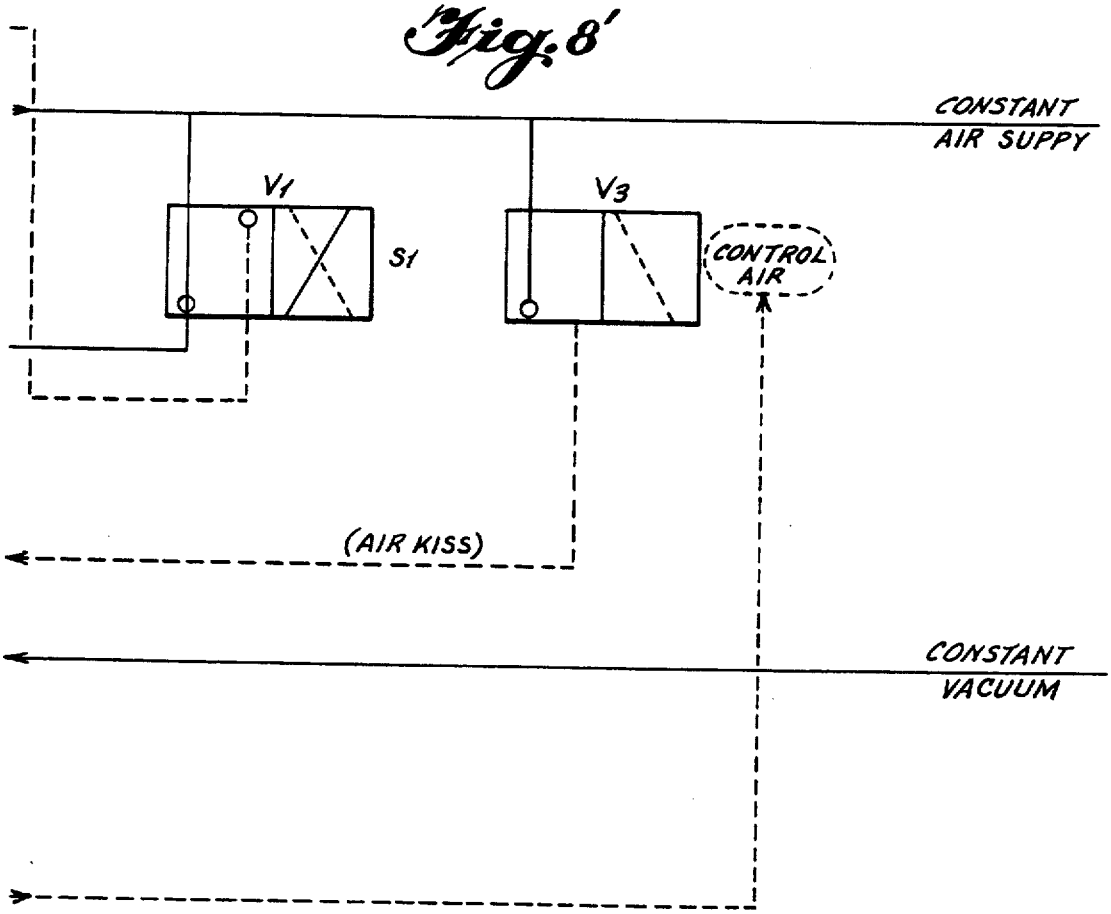
Figure 9:
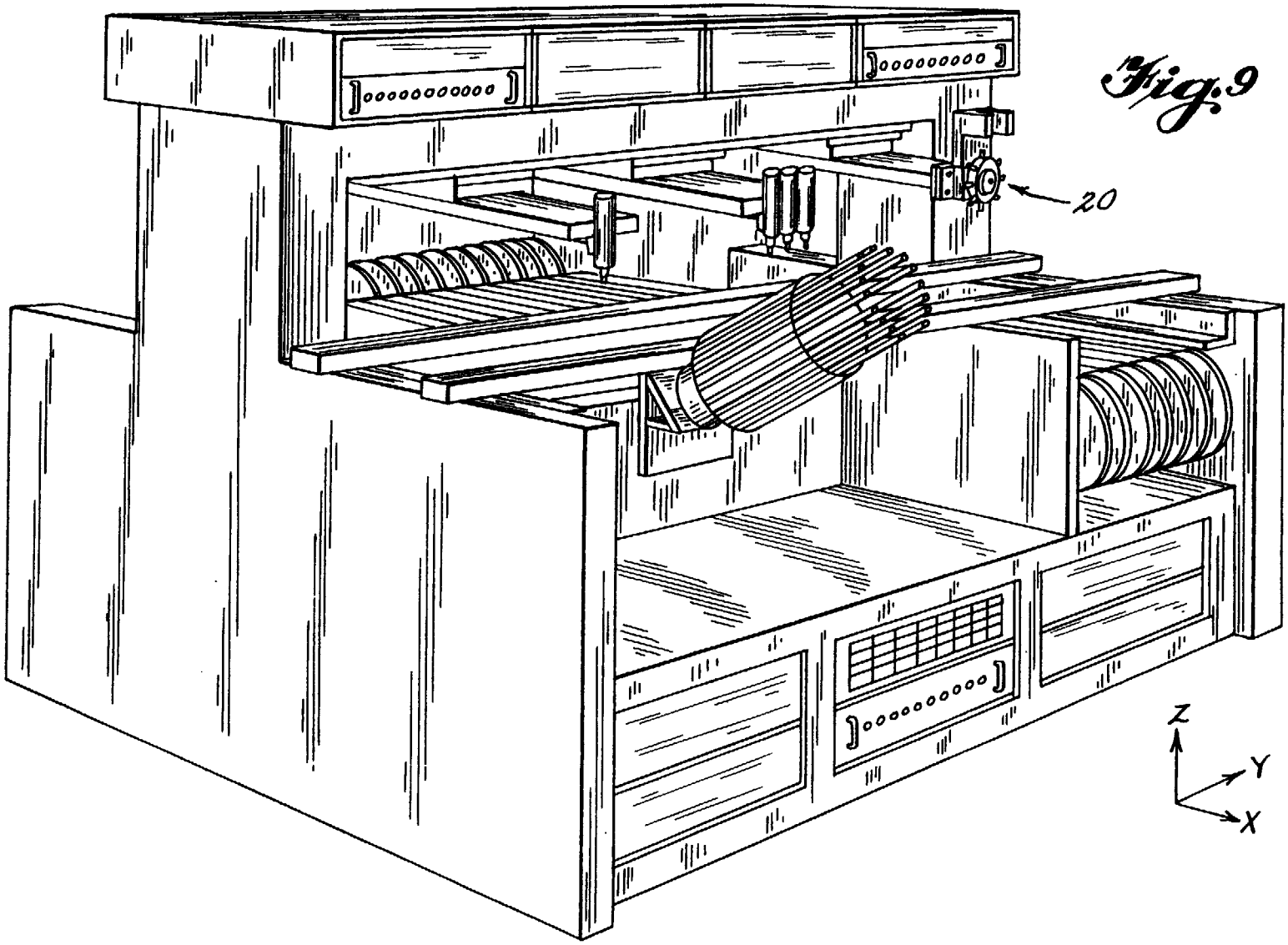
FIG. 9 is a perspective illustrating an overall machine by which the turret assembly may be translatable in X and Y between various forms of supply stations and the path of travel of a circuit board.

Referring to FIGS. 6 and 7, a spindle located at the component transfer station of the turret may be selectively extended or held in the retracted position during lower of piston rod 40 which, in turn, actuates the squaring assembly 90. In FIG. 6, the displacer 42' acts in much the same way as the earlier described displacer 42. However, in FIG. 7, during lowering of piston rod 40, air is supplied via hose 43 so as to prevent lowering of displacer 42' along with rod 40. Thus, a spindle located at the component transfer station of the turret assembly will not be extended during actuation of squaring assembly 90.

The following claims are intended to cover all of the generic and specific features of the invention herein described and all statements of the scope of the invention which as a matter of language, might be said to fall therebetween.

Now that the invention has been described, I claim:

1. In an apparatus for selectively performing the operations of picking components from one point and placing them at another point by means of a turret assembly having a rotatable turret with plural component holding spindles protruding therefrom and angularly spaced about a hub thereof, said picking and placing operations being performed by transferring components respectively to and from said spindles at a component transfer station of said turret assembly wherein said component transfer station is situated at a particular circumferential angular location about the hub of said turret, the improvement comprising:

displacer means for extending and retracting at least one of said spindles relative to said hub in order to perform said transferring;

said displacer means comprising a pin protruding laterally from said at least one spindle and into an annular groove of a guide ring generally centered on said hub, such that said pin rides in said groove during rotation of said turret to retain said spindle in a retracted condition;

said displacer means further comprising a section of said guide ring which is displaceable generally radially of said hub relative to the remainder of said guiding, said section comprising an arcuate portion of said annular groove; means for moving said section, so that when pin extends into the annular groove of said section, radial displacement of said section results in radial displacement of said spindle into an extended condition.

2. The improvement as in claim 1 and further comprising:

means for relocating said turret assembly and presenting said component transfer station of said turret at a selected one of said points for transferring said component in a direction generally normal to a plane containing said point.

3. The improvement as in claim 1, and further comprising:

means for rotating turret prior to relocating said turret assembly.

4. The improvement as in claim 1, and further comprising:

means for rotating turret during relocating said turret assembly.

5. The improvement as in claim 1, and further comprising:

means for rotating said turret after relocating said turret assembly.

6. The improvement as in claim 1, and further comprising:

means for retracting said spindle partially during said picking and placing according to pressures experienced by said component during said operations.

7. The improvement as in claim 6, and further comprising:

means for limiting said partial retracting in order to limit said pressure experienced by said component.

8. The improvement as in claim 7, and further comprising:

means for adjusting said limiting.

9. The improvement as in claim 1, and further comprising:

a squaring assembly and means for actuating said squaring assembly and thus squaring another component being held by another spindle which is not at said component transfer station.

10. The improvement as in claim 9, and further comprising:

means for actuating said squaring assembly generally simultaneously with said spindle extending and retracting.

11. The improvement as in claim 9, and further comprising:

means for preventing said spindle extending and retracting during actuating of said squaring assembly.

12. The improvement as in claim 9, and further comprising:

means for centering said other component upon actuating said squaring assembly.

13. The improvement as in claim 9, and further comprising:

means for testing electrical functioning of said other component upon actuating said squaring assembly.

14. The improvement as in claim 9, and further comprising:

means for orienting said other component upon actuating said squaring assembly.

*15. An apparatus for equipping printed circuit boards with electronic components, said apparatus comprising:*

*at least two supply stations;*

*a rotatable turret having a plurality of pick-up spindles for components, each said spindle having a vacuum nozzle suitable for picking components from any of said supply stations;*

*at least one processing station contiguous with said rotatable turret; and*

*means for displacing and positioning said turret together with said at least one processing station in X and Y directions, said means including programmable controller means for controlling the movement of said turret in said X and Y directions and permitting a plurality of components to be picked up from different supply stations by the plurality of vacuum nozzles so that the components picked up by said spindles from said supply stations can be passed by said processing station during indexing and translation of said turret and so that any of said plurality of components loaded on said plurality of spindles from any of said supply stations then may be placed on the circuit board at any programmable position.*

*16. An apparatus as in claim 15, wherein said processing station is a squaring and centering assembly.*

*17. An apparatus as in claim 15, wherein said processing station is a component tester.*

* * * * *